(12) United States Patent
Fukaya et al.

(10) Patent No.: US 7,173,201 B2
(45) Date of Patent: Feb. 6, 2007

(54) REMOTE CONTROLLER

(75) Inventors: Hiroyasu Fukaya, Aichi (JP);
Masayuki Nagata, Aichi (JP); Masato Wakabayashi, Aichi (JP); Sadaaki Shichino, Aichi (JP); Hiroshi Okazaki, Osaka (JP); Tomohiko Taki, Osaka (JP)

(73) Assignees: Inax Corporation, Tokoname (JP);
Sanwa Electronic Instrument Co., Ltd., Osaka (JP)

( * ) Notice: Subject to any disclaimer, the term of this patent is extended or adjusted under 35 U.S.C. 154(b) by 0 days.

(21) Appl. No.: 11/213,988

(22) Filed: Aug. 30, 2005

(65) Prior Publication Data

US 2006/0076220 A1    Apr. 13, 2006

(30) Foreign Application Priority Data

Oct. 13, 2004   (JP) .............................. 2004-299029

(51) Int. Cl.
*H01H 19/00*   (2006.01)
(52) U.S. Cl. ....................................... 200/6 A; 200/5 A
(58) Field of Classification Search .............. 200/5 A, 200/5 R, 6 A, 4, 6 R, 17 R, 18, 332, 333, 200/183, 32
See application file for complete search history.

(56) References Cited

U.S. PATENT DOCUMENTS

| | | | |
|---|---|---|---|
| 5,664,668 A * | 9/1997 | Zainal et al. ............... 200/332 |
| 6,225,579 B1 * | 5/2001 | Ritter et al. ................. 200/6 A |
| 6,248,966 B1 | 6/2001 | Nakase et al. |
| 6,344,619 B1 * | 2/2002 | Yamasaki et al. ........... 200/6 A |
| 6,525,279 B2 * | 2/2003 | Sato ........................... 200/6 A |
| 6,545,233 B2 * | 4/2003 | Takezawa .................... 200/6 A |
| 6,580,039 B2 * | 6/2003 | Nakade et al. ............... 200/6 A |
| 6,593,909 B1 * | 7/2003 | Chou .......................... 345/157 |
| 6,613,989 B2 * | 9/2003 | Tsuda et al. .................... 200/4 |
| 6,613,990 B2 * | 9/2003 | Kawasaki .................... 200/6 A |
| 6,765,165 B1 * | 7/2004 | Torrens ....................... 200/512 |
| 6,979,785 B2 * | 12/2005 | Yamasaki .................... 200/6 A |
| 6,984,793 B1 * | 1/2006 | Chew ............................. 200/4 |

FOREIGN PATENT DOCUMENTS

JP        2002-70115      3/2002

* cited by examiner

*Primary Examiner*—K. Lee
*Assistant Examiner*—Lisa Klaus
(74) *Attorney, Agent, or Firm*—Manabu Kanesaka

(57) ABSTRACT

A remote controller 1 is capable of achieving switching operation even when the user presses substantially any place of a switch. A toilet seat open/close switch 12 has a tiltable member 20 which is tiltably supported at its front lower portion to an upper portion of a main body 2, a switch body 30 which is pressed by the tiltable member 20 when the tiltable member 20 tilts, and a cap 40 which is mounted to the upper portion of the main body 2 such that the cap 40 can be freely displaced in the anteroposterior direction and the vertical direction. The tiltable member 20 is disposed in a cavity 41 formed inside the cap 40. As the cap 40 is pressed from front or from above, the tiltable member 20 is pressed by the cap 40 to tilt, whereby the switch body 30 conducts the switching action.

6 Claims, 7 Drawing Sheets

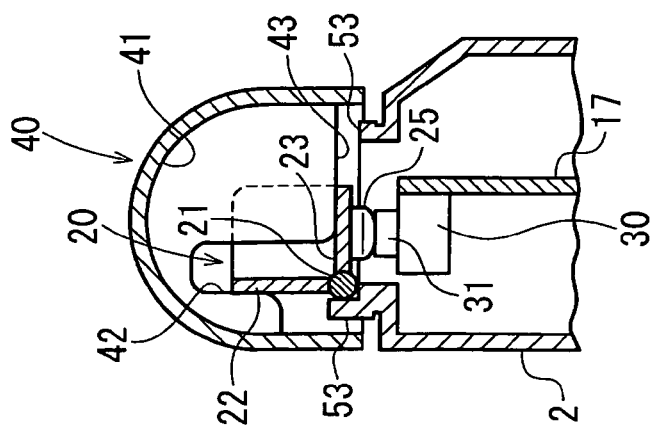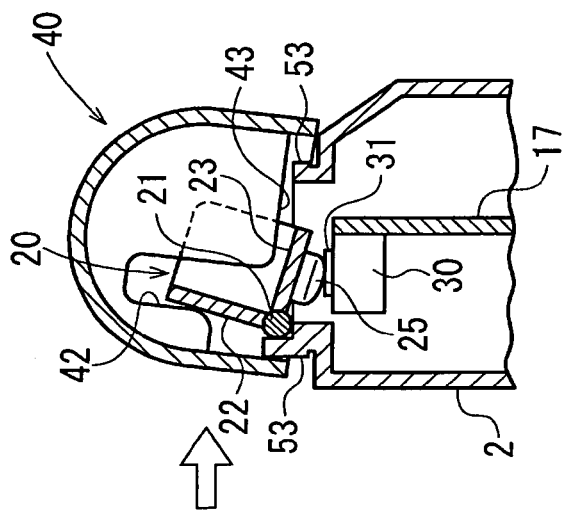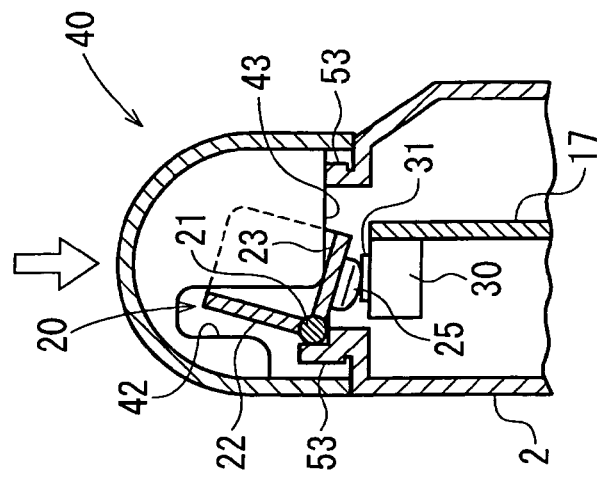

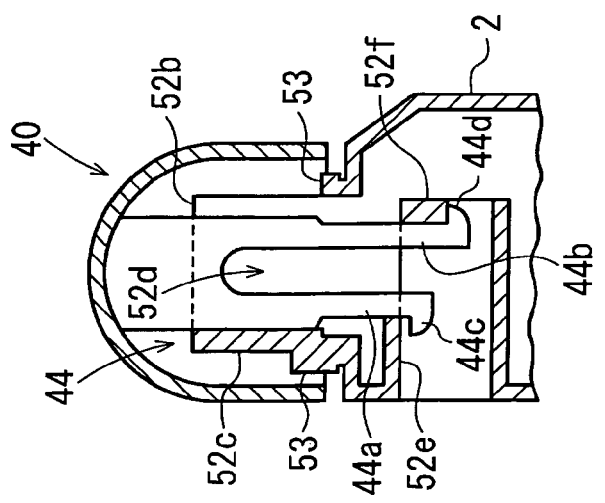
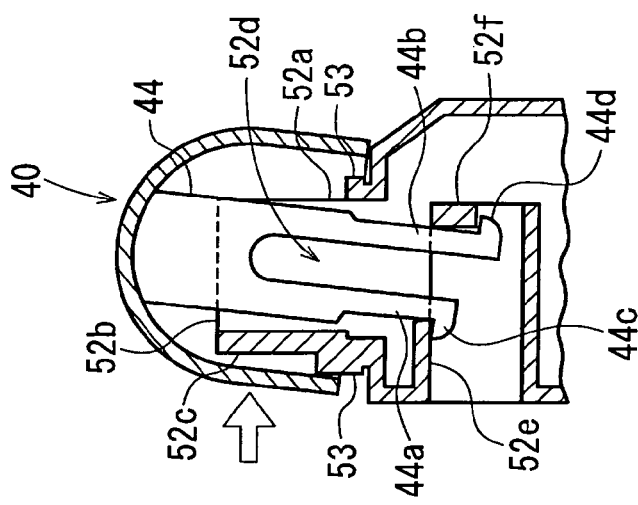
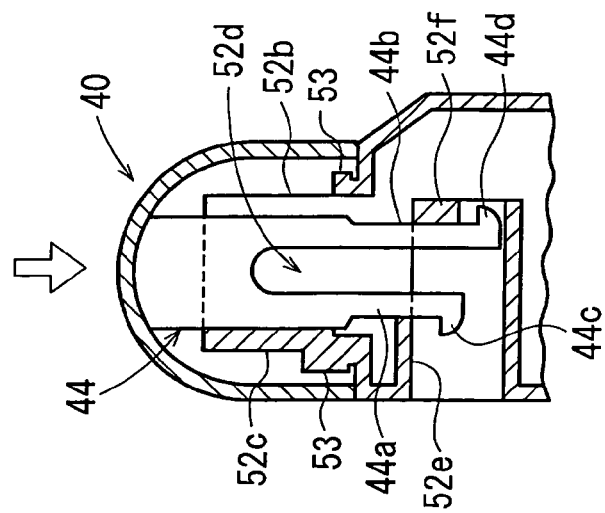

REMOTE CONTROLLER

RELATED APPLICATIONS

The present application is based on, and claims priority from, Japanese Application Number 2004-299029, filed Oct. 13, 2004, the disclosure of which is hereby incorporated by reference herein in its entirety.

FIELD OF THE INVENTION

The present invention relates to a remote controller attached to a wall of a lavatory or the like.

BACKGROUND OF THE INVENTION

A switch, which permits the user to control a toilet equipment, for example, to flush a toilet bowl with flushing water after use by operating the switch on a remote controller is widely prevalent. Such remote controller is usually located at a relatively lower position for the purpose of permitting the user to easily operate even when the user is seated on the toilet seat. Consequently, particularly in the case of a tall user, the user may have a difficulty in operating switches on the remote controller in his or her standing state.

JP 2002-70115A publication discloses a remote controller having a button as a switch to be operated, which is arranged to lie astride the top surface and the front surface of the remote controller. As shown in FIG. 5 of the '115 publication, an upper rear portion of the button is supported pivotally by a pivot pin. Accordingly, when the user presses the upper rear portion of the button, switching operation is not achieved because the button does not move downward. That is, the switching operation is not achieved unless the user presses an upper front portion of the button when the user operates from above.

SUMMARY OF THE INVENTION

A remote controller of the present invention has a main body to be attached to a wall; at least one tiltable member which is arranged on an upper portion of the main body and is supported to the main body such that the tiltable member tilts even when it is pressed from any direction between front and above; and at least one switch body which is pressed when the tiltable member tilts. The tiltable member is tiltably supported at its front lower side to the main body.

BRIEF DESCRIPTION OF THE DRAWINGS

FIGS. 6*a*, 6*b*, and 6*c* are sectional views showing operational states of the switch; and FIGS. 7*a*, 7*b*, and 7*c* are sectional views showing operational states of the switch.

DETAILED DESCRIPTION OF PREFERRED EMBODIMENTS

In a remote controller of the present invention, switching operation is achieved by pressing the tiltable member from any direction between front and above so as to make the tiltable member tilt. The tiltable member is tiltably supported at its front lower side to the main body. Therefore, even when a user presses any portion on the top of the tiltable member, for example, even when the user presses the upper rear portion, the tiltable member tilts so as to achieve the switching operation.

A cap may be attached to the top of the remote controller such that the cap is movable in the anteroposterior direction and the vertical direction. In this case, when the cap is pressed from any direction between front and above, the tiltable member is presses by the cap so as to tilt. The cap is formed to have a shape fitting the contour of the main body, thereby improving the design of the remote controller.

The cap may be provided with a cavity which is concaved upward from the bottom. In this case, the tiltable member is disposed inside the cavity, thereby keeping the volume of an assembly of the cap and the tiltable member to be relatively small.

The outer surface of the cap from the front side to the rear side via the top may be curved into an upward convex shape so that the user can easily touch the cap with his or her finger tip in either direction, i.e., from front or from above. The cap having this shape is hard to be pulled up by taking it between fingers, so that the cap is hardly tampered to be removed from the main body. Even if the space between the cap and the wall to which the remote controller is attached is very small, the cap tilts backward not to collide with the wall when the cap is pressed from front.

Hereinafter, a preferred embodiment will be described with reference to the attached drawings.

Figure 1:
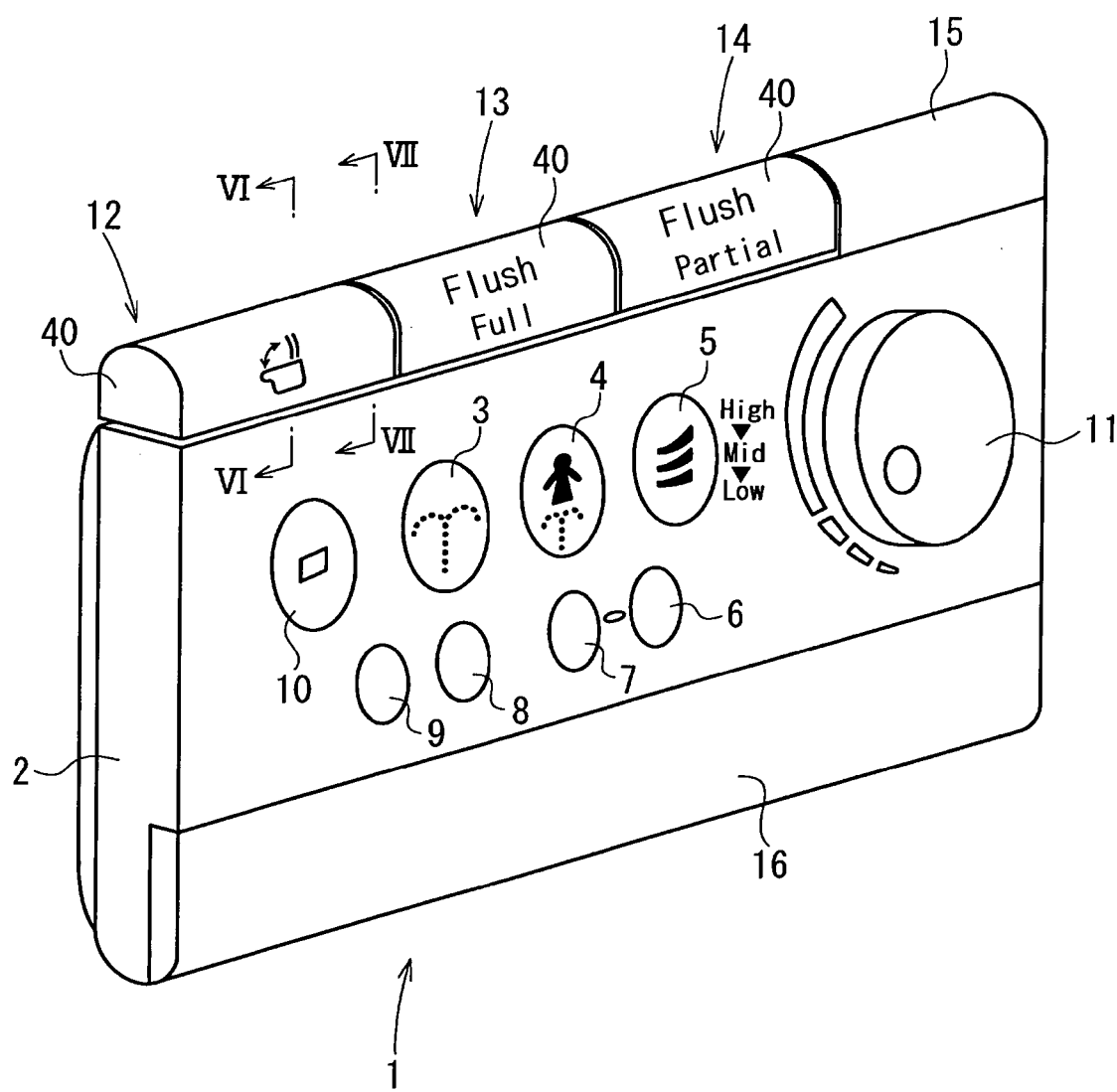
FIG. 1 is a perspective view of a remote controller according to an embodiment.
Figure 2:
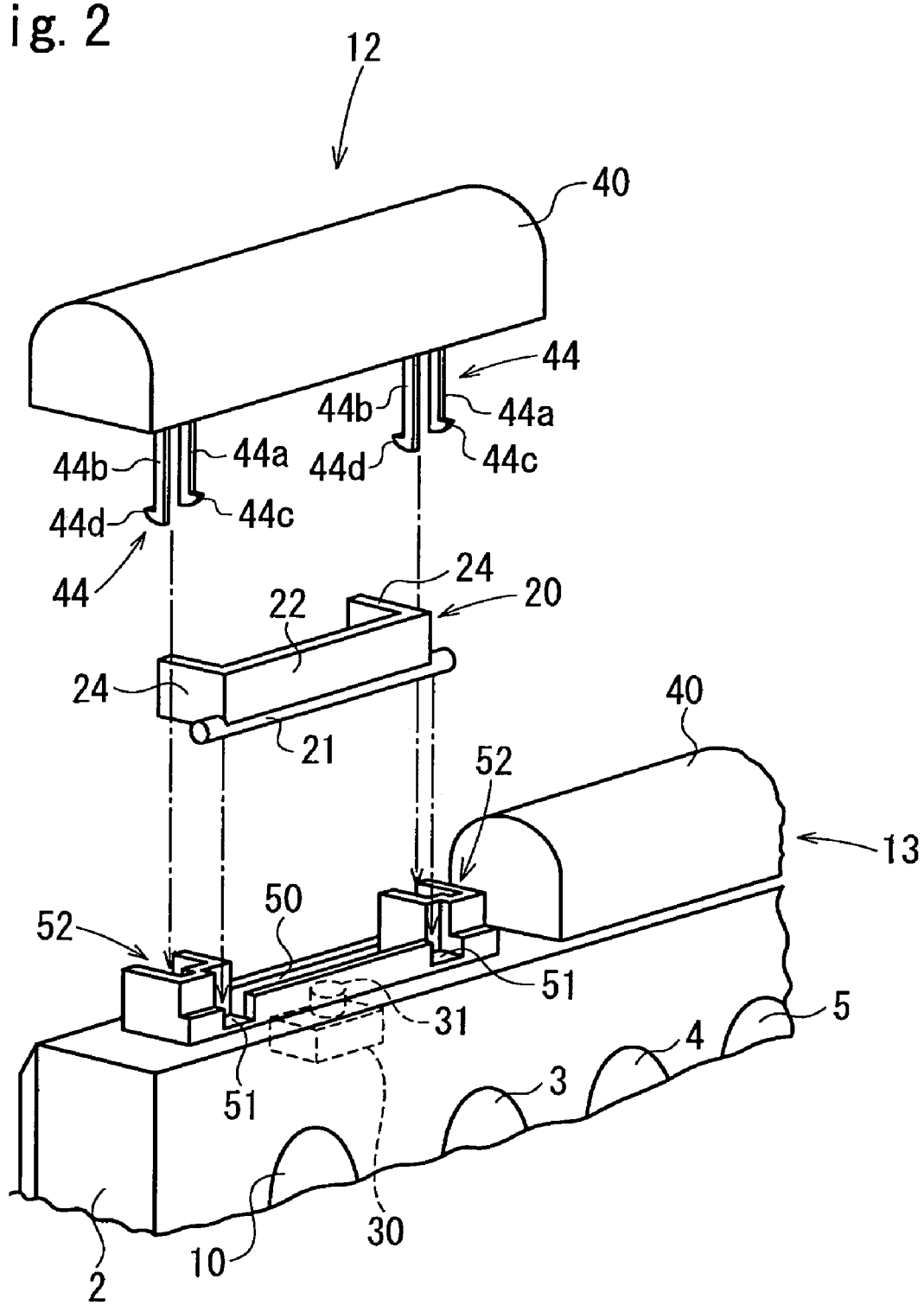
FIG. 2 is an exploded perspective view of a switch.
Figure 3:
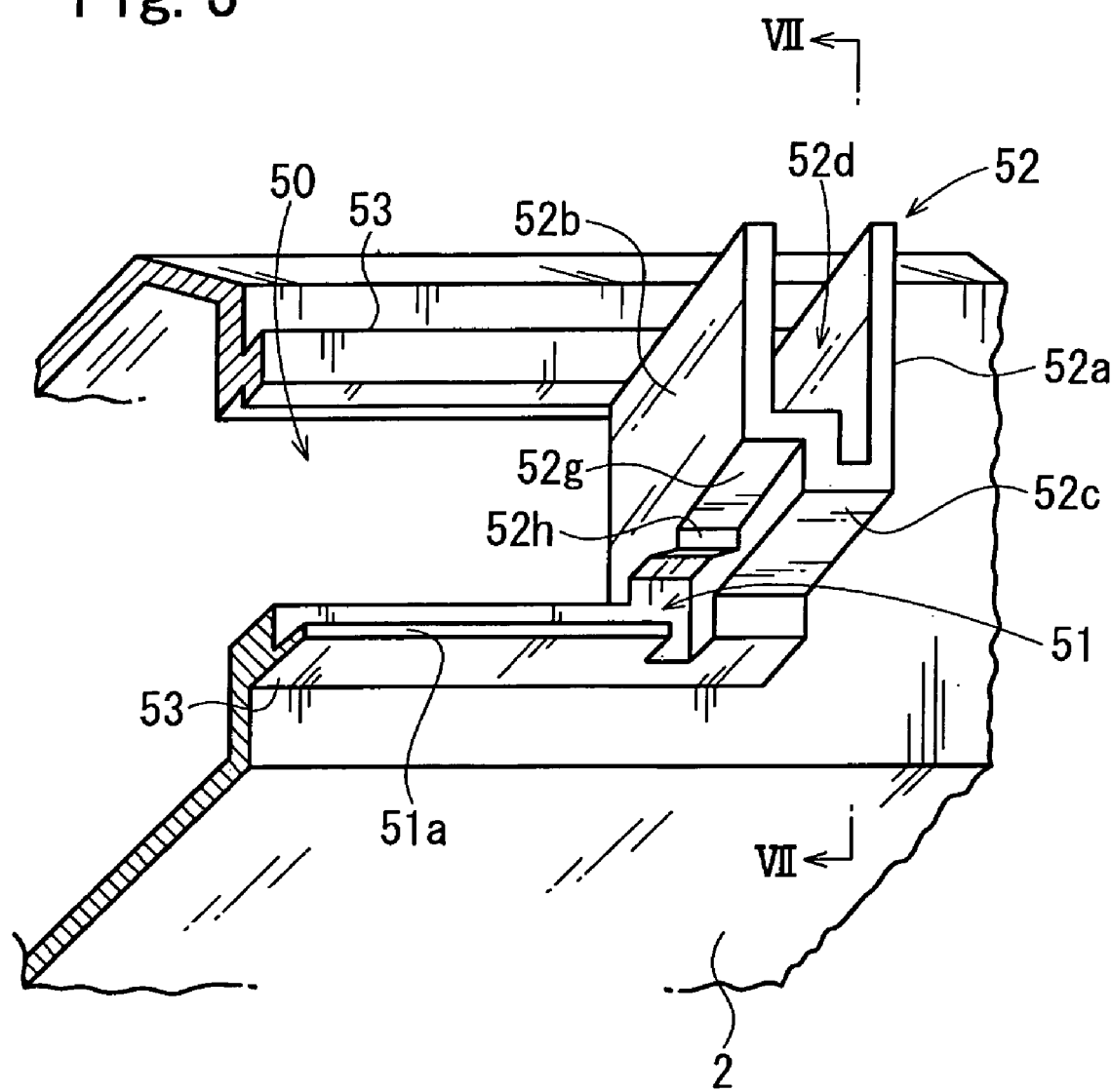
FIG. 3 is a sectional perspective view of an upper portion of a main body in a state that a cap and a tiltable member are removed.
Figure 4A:
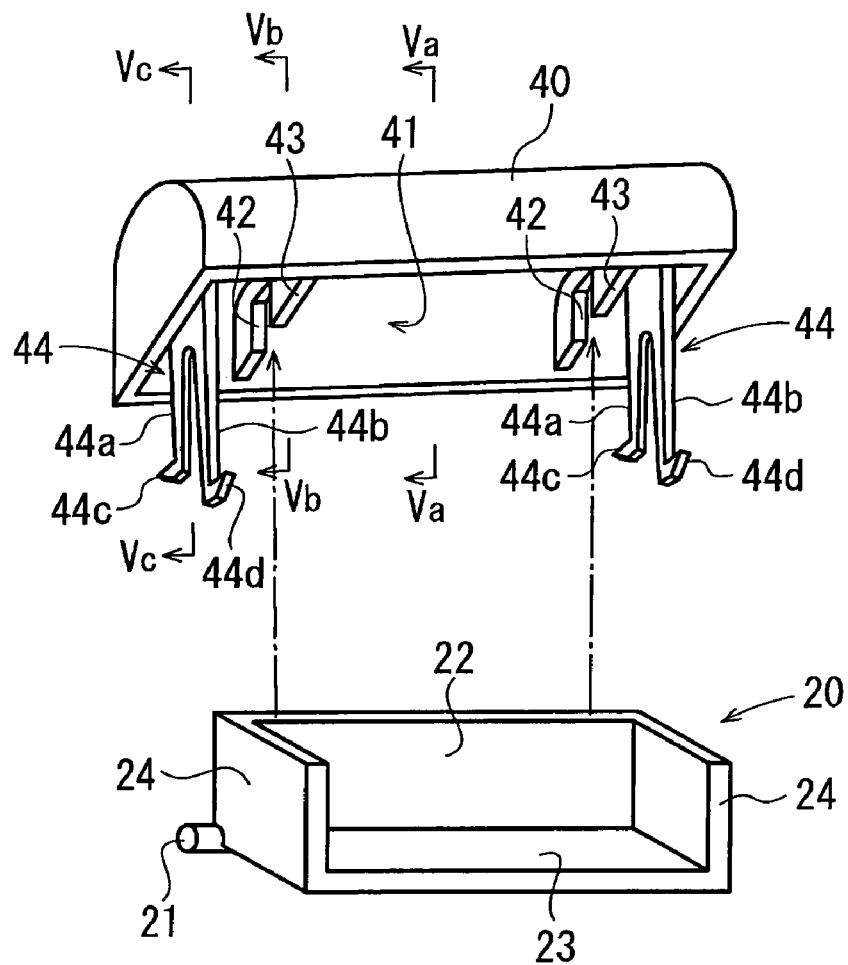
FIG. 4*a* is an exploded perspective view of the cap and the tiltable member and FIG. 4*b* is a perspective view of the bottom of the tiltable member.
Figure 4B:
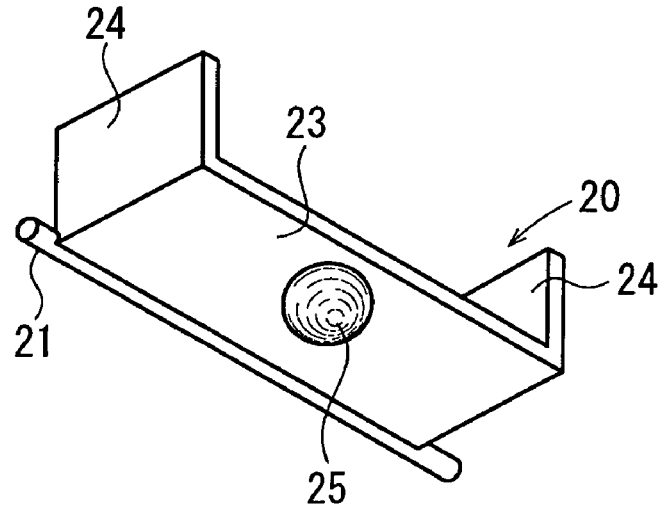
Figure 5A:
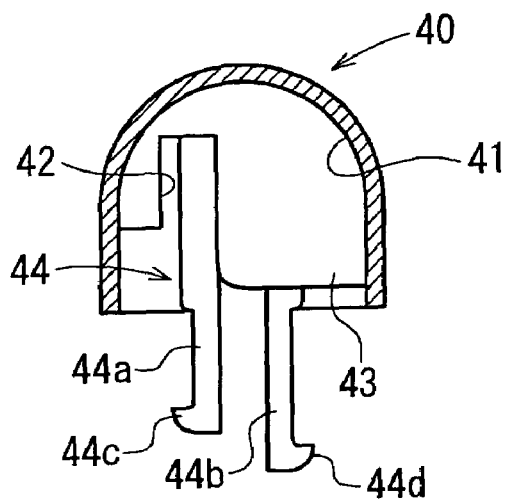
FIG. 5*a* is a sectional view taken along a line Va—Va of FIG. 4*a*.
Figure 5B:
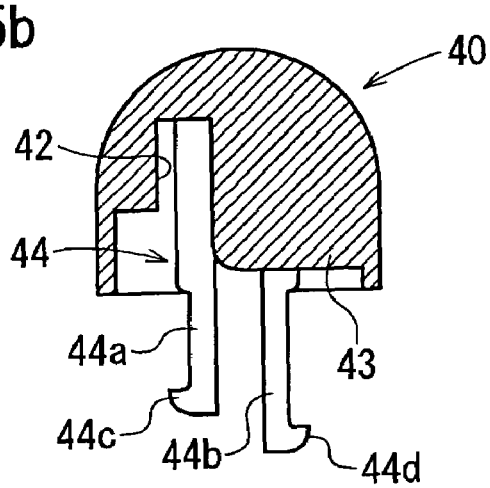
FIG. 5*b* is a sectional view taken along a line Vb—Vb of FIG. 4*a*.
Figure 5C:
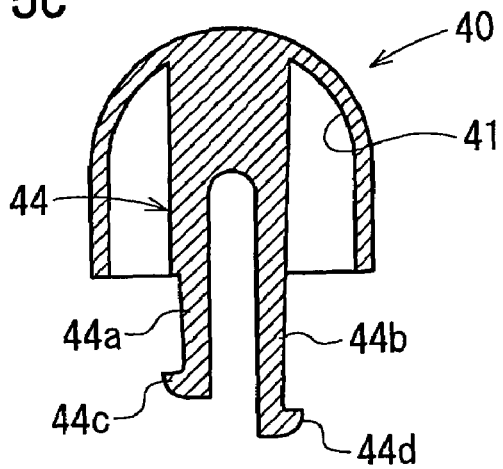
FIG. 5*c* is a sectional view taken along a line Vc—Vc of FIG. 4*a;*

FIG. 1 is a perspective view of a remote controller according to the embodiment, FIG. 2 is an exploded perspective view of a switch of the remote controller, FIG. 3 is a sectional perspective view of an upper portion of a main body in a state that a cap and a tiltable member are removed, FIG. 4*a* is an exploded perspective view of the cap and the tiltable member as seen from the opposite side as seen in FIG. 2, FIG. 4*b* is a perspective view of the bottom of the tiltable member, and FIGS. 5*a*, 5*b*, and 5*c* are sectional views taken along a line Va—Va of FIG. 4*a*, a line Vb–Vb of FIG. 4*a*, and a line Vc—Vc of FIG. 4*a*, respectively. FIG. 6*a* is a sectional view taken along a line VI—VI of FIG. 1, and FIGS. 6*b* and 6*c* are sectional views of the same portion as shown in FIG. 6*a* in a state that the cap is pressed from front and in a state that the cap is pressed from above, respectively. FIG. 7*a* is a sectional view taken along a line VII—VII of FIG. 1 and FIG. 3, and FIGS. 7*b* and 7*c* are sectional views of the same portion as shown in FIG. 7*a* in a state that the cap is pressed from front and in a state that the cap is pressed from above, respectively.

The remote controller 1 permits the user to remotely control a warm-water cleansing device, a flushing device, and a motorized toilet seat open/close device which are provided on a western-style toilet in a lavatory.

The warm-water cleansing device comprises a shower nozzle for cleansing the bottom of a user seated on the toilet seat, a bidet nozzle, a warm water tank for supplying warm water to the nozzles, a warm-air dryer for drying the bottom by blowing warm air to the bottom, and the like. The flushing device has a valve unit for supplying flushing Water to the toilet bowl. The motorized toilet seat open/close device raises or lays down the toilet seat by a motor.

The remote controller 1 has a main body 2 to be attached to a wall of the lavatory, front switches 3 through 10 and a dial 11 which are provided on the front surface of the main body 2, switches 12 through 14 and a transmitter portion 15 for sending commands from the respective switches and the dial to the respective devices, which are provided on the top of the main body. The upper surface of the main body 2 is separated substantially equally into four regions in the lateral direction. At these regions, in the order from the left, a toilet seat open/close switch 12, a full flushing switch 13, a partial flushing switch 14, and the transmitter portion 15 are arranged, respectively. However, the arrangement of the switches 12 through 14 is not limited thereto.

The front switches 3 through 10 are a bottom cleansing switch 3, a bidet switch 4, a drying switch 5, a forward switch 6 and a backward switch 7 for adjusting the nozzle position, a wide range ON/OFF switch 8, a massage ON/OFF switch 9, and a stop switch 10 for stopping the cleansing action or the drying action. The dial 11 is for adjusting the strength of water jet from each nozzle.

As the bottom cleansing switch 3 is pressed, warm water is spurted from a shower nozzle to cleanse the bottom of the user seated on the toilet seat. As the bidet switch 4 is pressed, warm water is spurted from a bidet nozzle.

As the frontward switch 6 is pressed during the bottom cleansing or bidet cleansing, the nozzle is moved forward so that the cleansing position shifts forward. As the backward switch 7 is pressed, the nozzle is moved backward so that the cleansing position shifts backward. As the wide range ON/OFF switch 8 is pressed once to set the wide-range cleansing function, the nozzle automatically repeatedly moves to and fro so as to cleanse a wider range during the bottom or bidet cleansing. As the wide range ON/OFF switch 8 is pressed once again, the wide-range cleansing function is cancelled.

As the massage ON/OFF switch 9 is pressed to set the massage function, the strength of water jet is varied to get stronger and weaker alternately to conduct massage during the bottom or bidet cleansing. As the massage ON/OFF switch 9 is pressed once again, the massage function is cancelled. The strength of water jet during the bottom or bidet cleansing is normally adjusted by turning the dial 11 clockwise or counter clockwise.

As the drying switch 5 is pressed once, relatively high temperature warm air is blown out. As it is pressed once again, the warm air is changed to medium temperature warm air. Further, as it is pressed again, the warm air is changed to relatively low temperature warm air. After that, the warm air is changed in the same manner, i.e. high-medium-low manner. As the stop switch 10 is pressed, the aforementioned cleansing action or the drying (warm air blowing) action is stopped. In this embodiment, self-stopping mechanism is employed to automatically stop the cleansing after two minutes from the start and to automatically stop the drying after four minutes from the start.

In this embodiment, the main body 2 is provided at its front lower surface with a front lid 16. The front lid 16 is allowed to be opened forward or closed by a hinge (not shown). Behind the front lid 16, auxiliary control switches (not shown) such as a water temperature adjusting switch and a seat temperature adjusting switch are provided.

As the toilet seat open/close bottom 12 is pressed in a state that the toilet seat lies down on the toilet bowl, the motor is actuated to raise the toilet seat. As the toilet seat open/close bottom 12 is pressed in a state that the toilet seat is raised, the motor is actuated reversely to lay down the toilet seat onto the toilet bowl. As the full flushing switch 13 is pressed, a large quantity of washing water is supplied to a basin portion of the toilet bowl. As the portion flushing switch 14 is pressed, a small quantity of washing water is supplied to the basin portion of the toilet bowl.

Since these switches 12 through 14 have the same structure, the structure of the switches will be described below with reference to the toilet seat open/close switch 12.

The toilet seat open/close switch 12 has a tiltable member 20 which is tiltably supported at its front lower portion to an upper portion of the main body 2 so that the tiltable member 20 can tilt even when it is pressed from any direction between front and above, as shown in FIGS. 6a–6c, a switch body 30 which is pressed by the tiltable member 20 when the tiltable member 20 tilts so as to conduct switching action, and a cap 40 which is mounted to the upper portion of the main body 2 such that the cap 40 can be freely displaced in the anteroposterior direction and the vertical direction.

As shown in FIG. 3, the upper surface of the main body 2 is provided with openings 50 in the respective regions for the switches 12 through 14. The respective switch bodies 30 of the switches 12 through 14 are arranged in the openings 50. The switch bodies 30 are mounted on a circuit board 17 (FIGS. 6 and 7) inside the main body 2. In this embodiment, each switch body 30 has an actuator 31 which retracts when pressed to conduct the switching action. The actuator 31 is arranged to face upward the opening 50.

Near the left and right ends of the front edge of the opening 50, bearing portions 51, 51 for holding a rotary shaft 21 of the tiltable member 20 as will be described later are formed. At the left and right edges of the opening 50, leg receiving portions 52, 52 for receiving legs 44, 44 of the cap 40 as will be described later are formed, respectively.

The tiltable member 20 has the rotary shaft 21 extending in the lateral direction of the main body 2, a vertical piece 22 extending upward from the rotary shaft 21, a horizontal piece 23 extending backward from the rotary shaft 21 at right angle to the vertical piece 22, rib pieces 24, 24 connecting the left ends of and the right ends of the vertical piece 22 and the horizontal piece 23, respectively, and a convex portion 25 projecting downward from the bottom of the horizontal piece 23.

The shaft 21 is disposed along the front edge of the opening 50 such that the both ends of the shaft 21 are held by the bearing portions 51, 51. The horizontal piece 23 extends inside of the opening 50 to cover the upper side of the switch body 30. The convex portion 25 on the bottom of the horizontal piece 23 faces the upper end of the actuator 31 of the switch body 30. The convex portion 25 is made of a relatively flexible synthetic resin or rubber.

The cap 40 has a semi-cylinder shape of which outer surface from the front side to the rear side via the top is curved into an upward convex shape. The cap 40 has a cavity 41 which is concaved upward from the bottom. The tiltable member 20 and the bearing portions 51, 51 and the receiving portions 52, 52 around the opening 50 are accommodated inside the cavity 41. As shown in FIG. 6a, backward pressing pieces 42 facing the front of the vertical piece 22 and downward pressing pieces 43 facing the upper surface of the horizontal piece 23 are formed to project from the inner surface of the cavity 41.

In this embodiment, as shown in FIG. 5b, the backward pressing piece 42 and the downward pressing piece 43 are formed integrally as a partition extending across the cavity 41 in an anteroposterior direction.

Between the backward pressing piece 42 and the downward pressing piece 43, a concavity (without reference numeral) cut away from the lower edge of the partition is formed. The vertical piece 22 enters the concavity.

Legs 44, 44 are suspended downward from a left end portion and a right end portion of the ceiling of the cavity 41. The legs 44, 44 extend downward over the bottom of the cap 40. Each leg 44 is branched into a front piece 44a and a rear piece 44b from the middle in the downward direction. The rear piece 44b extends downward longer than the front piece 44a. The front piece 44a and the rear piece 44b are elastically deformable in the direction of moving apart from and closer to each other. The front piece 44a and the rear piece 44b are provided at their lower ends with pawls 44c, 44d which project in a direction apart from each other.

The legs 44, 44 are received with the aforementioned receiving portions 52, 52 in such a manner as to allow the displacement of the legs 44, 44 in the vertical and anteroposterior directions.

As shown in FIG. 3 and FIGS. 7a through 7c, each receiving portion 52 has a side wall 52a projecting upward from a side edge of the opening 50, a facing wall 52b which is formed at an inner side of the opening 50 to face the side wall 52a with a distance from the side wall 52a, a front-side wall 52c connecting the front side edges of the side wall 52a and the facing wall 52b, a leg passage 52d surrounded by the side wall 52a, the facing wall 52b, and the front-side wall 52c, and a front piece engaging portion 52e and a rear piece engaging portion 52f (only shown in FIGS. 7a–7c) formed at a lower side of the passage 52d.

To mount the cap 40, the legs 44 are inserted from above into the leg passages 52d of the receiving portions 52, respectively. During this, the front piece 44a and the rear piece 44b of the leg 44 are elastically deformed to pass between the front piece engaging portion 52e and the rear piece engaging portion 52f so that the pawls 44c, 44d at the lower ends thereof are engaged with the lower ends of the engaging portions 52e, 52f.

As shown in FIG. 7a, in the state that the pawls 44c, 44d are in contact with the lower ends of the engaging portions 52e, 52f, respectively, there is a space between the bottom of the cap 40 and the top of the main body 2. In the normal state (when the cap 40 is not pressed from front nor from above), the cap 40 is lifted via the horizontal piece 23 and the downward pressing piece 43 by the upward return force of the actuator 31 so that the cap 40 is in the state as shown in FIG. 7a.

As the cap 40 is pressed from front in the state shown in FIG. 7a, the cap 40 tilts backward as shown in FIG. 7b, the backward pressing piece 42 presses the vertical piece 22 backward to tilt the tiltable member 20. On the other hand, as the cap 40 is pressed from above in the state shown in FIG. 7a, the cap 40 lowers as shown in FIG. 7c so that the downward pressing piece 43 presses downward the horizontal piece 23, thereby tilting the tiltable member 20. By the tilting of the tiltable member 20, the actuator 31 is pressed downward via the convex portion 25.

In this embodiment, the periphery of the opening 50 is formed with a convexly stepped portion 53 higher than the surrounding portion. As the cap 40 is displaced backward or downward for a predetermined amount, the convexly stepped portion 53 is structured to come in contact with the inner wall of the cavity 41 or the lower edge of the downward pressing piece 43 as shown in FIGS. 6b and 6c, thereby preventing further displacement of the cap 40.

As shown in FIG. 3, a concavely stepped portion 52g is formed in the front side wall 52c of the receiving portion 52 from the middle in the width direction of the opening 50 such that the concavely stepped portion 52g retracts toward the rear of the main body 2. The end of the rotary shaft 21 is disposed at a lower end of the concavely stepped portion 52g. At the front edge of the opening 50, a confronting piece 51a which confronts the rotary shaft 21 from the front side is formed, thereby holding the end of the rotary shaft 21 in the concavely stepped portion 52g. In addition, an elastic projection 52h is formed on the middle of the concavely stepped portion 52g in the vertical direction for preventing the end of the rotary shaft 21 from coming off the lower end of the concavely stepped portion 52g. That is, in this embodiment, the bearing portion 51 is composed of the concavely stepped portion 52, the confronting piece 51a, and the elastic projection 52h.

To engage the rotary shaft 21 to the bearing portion 51, the end of the rotary shaft 21 is fallen from above along the concavely stepped portion 52g and is pressed into the lower end of the concavely stepped portion 52g through between the elastic projection 52h and the confronting piece 51a.

In the remote controller 1 having the aforementioned structure, to operate one of the switches 12 through 14, the cap 40 of the switch is pressed from front or from above. Accordingly, the tiltable member 20 tilts and the actuator 31 is pressed downward, whereby the switch body 30 conducts the switching action.

In the remote controller 1, the tiltable member 20 is tiltably supported at its front lower portion to the main body 2 via the rotary shaft 21 so that the tiltable member 20 can tilt. Therefore, the tiltable member 20 is tilted, even when the user presses the cap 40 from any direction between front and above, at its any portion except for the front lowest portion thereof, thereby conducting the switching action.

In this embodiment, the cap 40 is mounted to the tiltable member 20. The cap 40 may be formed to have a shape fitting the contour of the main body 2, thereby improving the design of the remote controller.

Further in this embodiment, the tiltable member 20 is arranged inside the cap 40. Therefore, even when the cap 40 is formed to have wide surface for facilitating the operation, the volume of an assembly of the cap 40 and the tiltable member 20 can be relatively small.

In this embodiment, since the outer surface from the front side to the rear side via the top of the cap 40 is curved into an upward convex shape, the user can easily touch the cap 40 with his or her finger tip in either direction, i.e., from front or from above. The cap 40 having this shape is hard to be pulled up between fingers, so that the cap 40 is hardly tampered to be removed from the main body 2. It should be noted that even when the space between the cap 40 and the wall to which the remote controller is attached is very small, the cap 40 tilts backward not to collide with the wall when the cap 40 is pressed from front.

In this embodiment, since the amount of displacement of the cap 40 in the backward direction and the downward direction is restricted, the switch body 30 is prevented from being applied with excess load even when the cap 40 is strongly pressed.

The aforementioned embodiment is one of examples of the present invention so that the present invention is not limited to the aforementioned embodiment. For example, the cap may have another shape, not the illustrated shape.

In the present invention, some or all of the switches 12, 13, 14 may be provided, in their upper surfaces, with concavities and/or convexities. In this case, the concavities and/or convexities formed in the upper surfaces of the respective switches may be different in the size, the array arrangement, and/or the configuration, thereby allowing the user to distinguish each switch by the touch of his or her finger. One of the switches may be provided with no convexities and the other switches may be provided with convexities, thereby providing different touch to the one switch from the other switches.

Examples of the convexities include dot-like projections and ridges extending in the lateral direction, while examples of the concavities include dents and grooves extending in the lateral direction.

The foregoing is considered illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to that fall within the scope of the invention and the appended claims.

The present application is based on, and claims priority from, Japanese. Application Serial Number 2004-299029, filed Oct. 13, 2004, the disclosure of which is hereby incorporated by reference herein in its entirety.

What is claimed is:

1. A remote controller comprising:
   a main body to be attached to a wall;
   at least one tiltable member which is arranged on an upper portion of the main body and is supported to the main body such that the tiltable member tilts even when it is pressed from any direction between front and above, said tiltable member being tiltably supported at its front lower side to the main body;
   at least one switch body which is pressed when the tiltable member tilts, and
   at least one cap mounted to the upper portion of the main body such that the cap is able to be displaced in an anteroposterior direction and a vertical direction,
   whereby when the cap is pressed from any direction between front and above and is accordingly displaced backward or downward, the tiltable member is pressed by the cap to tilt so as to press the switch body.

2. A remote controller as claimed in claim 1, wherein the cap is provided with a cavity which is concaved upward from a bottom thereof, and the tiltable member is disposed inside the cavity.

3. A remote controller as claimed in claim 1, wherein an outer surface from a front side to a rear side via a top of the cap is curved into an upward convex shape.

4. A remote controller as claimed in claim 3, wherein an upper surface of the main body extends in a lateral direction; a plurality of caps is arranged on said upper surface and is aligned in an extending direction of said upper surface; and the outer surfaces of the caps are flush with each other.

5. A remote controller as claimed in claim 4, wherein a transmitter portion is provided on the upper surface of the main body and the transmitter portion has an outer surface flush with the outer surfaces of the respective caps.

6. A remote controller as claimed in claim 1, wherein said remote controller is attached to a wall of a lavatory and outputs at least a control signal to a flushing device.

* * * * *